United States Patent [19]

Yamaji et al.

[11] Patent Number: 5,634,207
[45] Date of Patent: May 27, 1997

[54] FREQUENCY CONVERTER CAPABLE OF REDUCING NOISE COMPONENTS IN LOCAL OSCILLATION SIGNALS

[75] Inventors: Takafumi Yamaji, Ichikawa; Hiroshi Tanimoto, Kawasaki; Satoshi Arai, Musashino, all of Japan

[73] Assignee: Kabushiki Kaisha Toshiba, Kawasaki, Japan

[21] Appl. No.: 600,115

[22] Filed: Feb. 12, 1996

[30] Foreign Application Priority Data

Feb. 13, 1995 [JP] Japan .................................. 7-047774

[51] Int. Cl.$^6$ ................................................ H04B 1/26
[52] U.S. Cl. ............................................................ 455/323
[58] Field of Search ........................................ 363/159, 163, 363/164, 165, 173; 455/314, 315, 323, 325, 333

[56] References Cited

U.S. PATENT DOCUMENTS

| | | | |
|---|---|---|---|
| 4,184,120 | 1/1980 | Tehsirogi | 325/436 |
| 4,361,910 | 11/1982 | Teller, Jr. | 455/320 |
| 4,369,522 | 1/1983 | Cerny, Jr. et al. | 455/333 |
| 4,479,259 | 10/1984 | Fenk | 455/318 |
| 5,113,094 | 5/1992 | Grace et al. | 327/119 |
| 5,446,923 | 8/1995 | Martinson et al. | 445/330 |
| 5,469,120 | 11/1995 | Nguyen et al. | 331/177 R |
| 5,534,827 | 7/1996 | Yamaji | 332/103 |

FOREIGN PATENT DOCUMENTS 0051179  5/1982  European Pat. Off. .

OTHER PUBLICATIONS

Christopher D. Hull and Robert G. Meyer, A Systematic Approach to the Analysis of Noise in Mixers, published in IEEE Transactions on Circuits & Systems, vol. 40, No. 12, Dec. 1993.

*Primary Examiner*—Matthew V. Nguyen
*Attorney, Agent, or Firm*—Foley & Lardner

[57] ABSTRACT

A frequency converter includes a high-frequency signal input circuit for forming a high-frequency signal with bias voltage or current to output a bias-added high-frequency signal; a local oscillation signal input circuit having a first element for forming a local oscillation signal with bias voltage or current and an element for suppressing a noise component having a frequency near a frequency of multiple of even number of a local oscillation frequency to output a bias-added and noise suppressed local oscillation signal; and a multiplication circuit for multiplying the bias-added high-frequency signal and the bias-added and noise suppressed local oscillation signal. By the constitution, it is possible to convert the high-frequency signal into a desired frequency signal having low influence of noises having frequency near the frequency of multiple of even number especially zero or two of the local oscillation signal to thereby reasonably suppress gain and noise in the high-frequency amplifier and local oscillator and reducing a current consumption of a radio receiver.

12 Claims, 19 Drawing Sheets

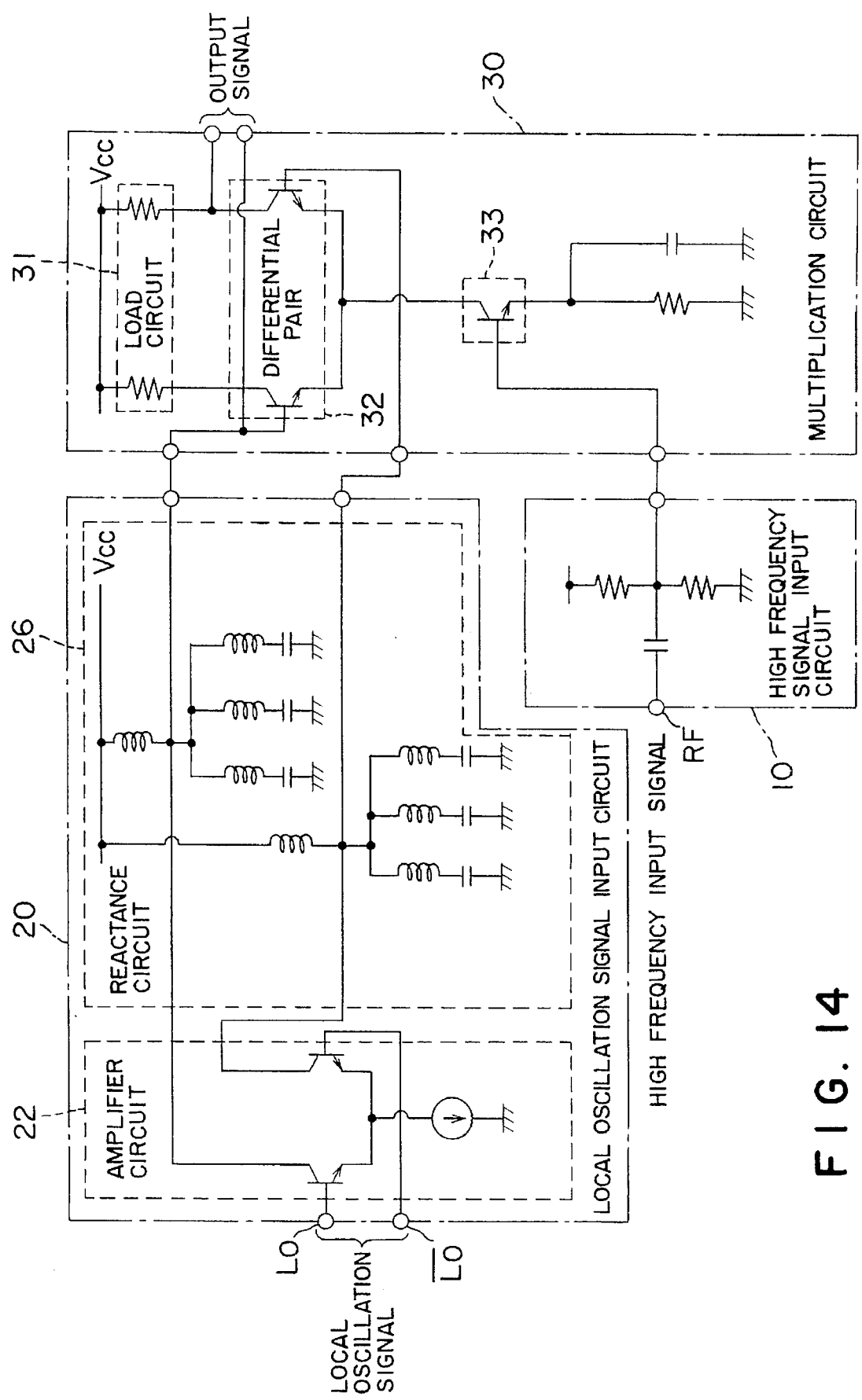
F I G. 14

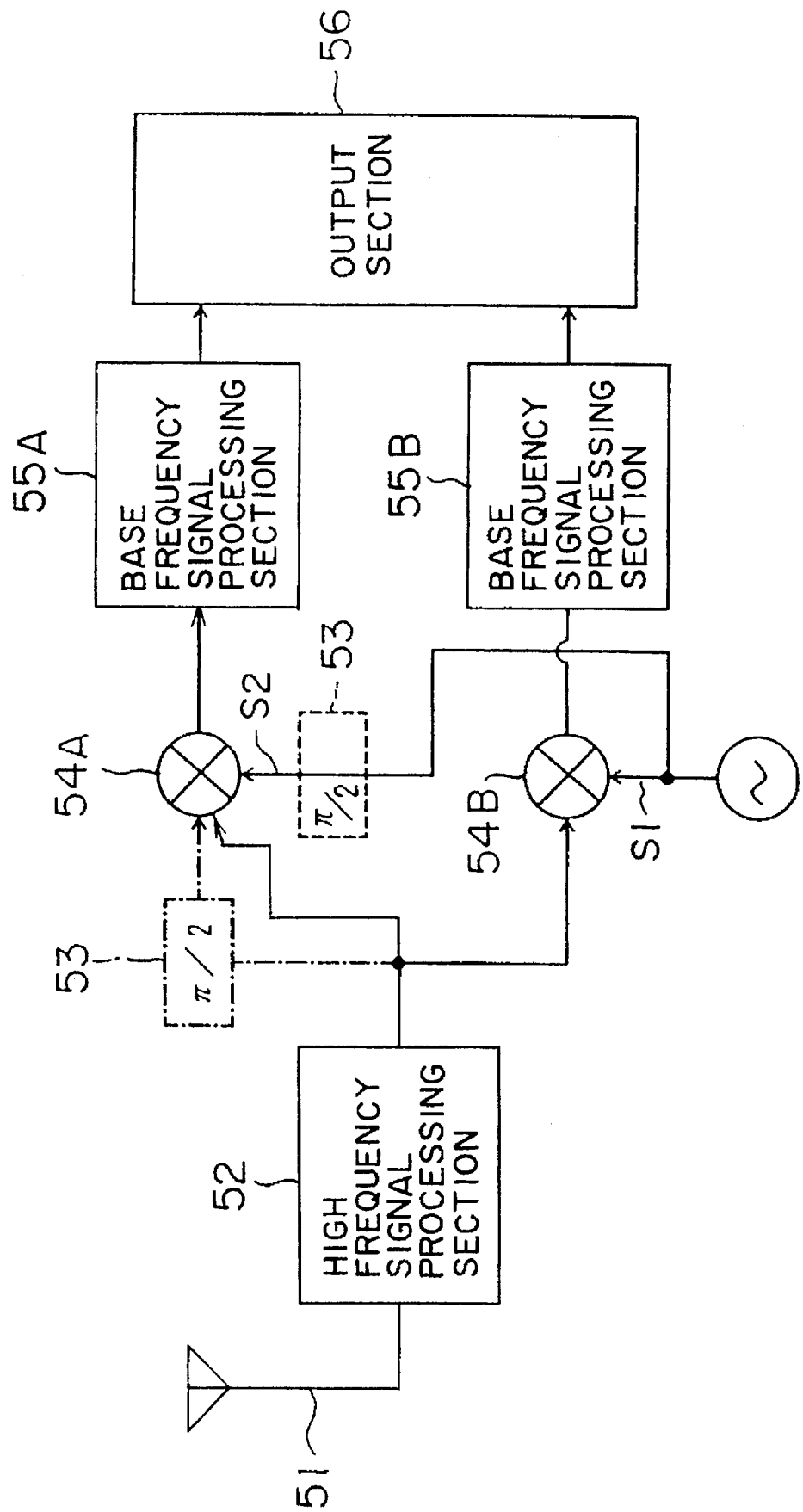
F I G. 18

FREQUENCY CONVERTER CAPABLE OF REDUCING NOISE COMPONENTS IN LOCAL OSCILLATION SIGNALS

BACKGROUND OF THE INVENTION

The present invention relates to a frequency converter used in radio signal receiving apparatus, particularly to, a frequency converter capable of reducing noise components included in local oscillation signals.

A frequency converter shown in FIG. 1 has been well known as the conventional converter, which roughly comprises a high-frequency signal input circuit 10 for outputting a bias voltage and an inputted high-frequency signal such as a radio frequency -RF- which has undergone impedance and the like, a local oscillation signal input circuit 2 including bias adding means 28 or outputting a bias voltage and an inputted local oscillation signal supplied from local oscillator (not shown), and a multiplication circuit 30 for generating an output signal as an intermediate frequency -IF- signal by a multiplication of the high-frequency signal and the local oscillation signal supplied after each of bias voltage is respectively determined by the input circuits 10 and 2.

The local oscillation signal input circuit 2 inputs the local oscillation signal, adds a bias potential or current to the inputted local oscillation signal, and outputs a bias-added local oscillation signal. The input circuit 2 outputs not only supplied noises as they are, which are superposed on the local oscillation signal, but also original noises such as thermal noises occurring in the local oscillation input circuit 2. Accordingly, various noise components are included in the local oscillation signal.

There is described operation of the conventional frequency converter. A signal supplied to a terminal RF is inputted into a base terminal of a transistor Tr1 of the multiplication circuit 30 through the high-frequency input circuit 10. On the other hand, the local oscillation signal supplied to a terminal Lo is inputted into respective base terminals of transistors Tr2 and Tr3 constituting a differential pair through the local oscillation signal input circuit 2. Operation of the differential pair has been described in "Analysis and Design of Analog integrated Circuits" written by P.R.Gray and R.G.Meyer, in which a current inputted to common emitter terminal thereof is distributed to both of the transistors Tr2 and Tr3 on the basis of a potential difference between respective bases thereof, and collector currents of the transistors are thus outputted. The collector currents are converted into respective voltage outputs in a load circuit of the multiplication circuit 30.

The frequency converter using the transistor is differential pair causes the transistors to operate as a switch by a large amplitude of a voltage supplied to both base terminals thereof for purpose of a reduction of change of a conversion gain.

An output at this time can be expressed by an equation (i) as follows:

$$Vout(t) = K \times F(t) \times \{Irf(t) + Iee\} \quad (1),$$

where Irf denotes a high-frequency signal current outputted from a collector of the transistor Tr1, Iee denotes a bias current flowing to the collector of the transistor Tr1, F(t) denotes a function of which "1" and "−1" alternately appear at the same frequency as the frequency of the local oscillation signal, and K denotes a constant determined by the load circuit.

The function F(t) includes frequency components which are multiple of integer of the frequency of the local oscillation signal, and a rate of the components changes with a duty ratio.

As has been shown in the previous transcript C-82 of a lecture of a sprang conference in 1994 of an Institute of Electronics, Data and Communication Engineers of Japan, the current Irf is inputted into a frequency mixer after a bandpass filter (BPF) removes unnecessary signal components. Desired signals can be expressed by the term of "$\sin(2\pi ft) \times Irf$" in the equation (1), where the symbol $f$ denotes a frequency of the local oscillation signal.

There has been described above the relationship between an output and input including a local oscillation signal and high-frequency signal. It is necessary to carefully design communication equipments especially receiver dealing with a fine radio signal for the purpose of avoiding a remarkable deterioration of a signal quality by noises generated in each of circuit elements. Even though filters prevent the high-frequency input signal in many receivers from a mixture of unnecessary signals and noises as described above, it has been considered that the local oscillation signal undergoes small influence noises because noise level is smaller than a level of the local oscillation signal. However, the noises in the local oscillation signal input circuit appear strong in the output so as to cause a signal quality to be deteriorated by the following reasons.

For the purpose of simplifying the description, noises will be described in this specification on the assumption that they are replaced by disturbance signals having a single frequency. Accordingly, the local oscillation signal and the disturbance signal are assumed to be inputted to the base input terminals of the transistors of the differential pair In the multiplication circuit. The differential pair can be regarded as a switch which changes over a current by positive and negative phases of the input signal. FIG. 2 is a characteristic diagram showing the case where the disturbance signal has a frequency twice as large as a frequency of the local oscillation signal. In the figure, a solid line shows a graph of the local oscillation signal, and dotted line and chain line show graphs of the product of the disturbance signal and minus one (−1), respectively. Accordingly, a zero-cross point of voltages between the bases of the differential pair is represented by a cross point of the solid and dotted lines (shown by symbol ⊙ in the figure), or by a cross point of the solid and chain lines (shown by symbol ○ in the figure). As shown in the figure, when a phase of the disturbance signal changes, a time length in which an input of the differential pair is positive changes with the phase of the disturbance signal. When a frequency of the disturbance signal deviates from a value twice greater than the local oscillation signal, a phase relationship of both signals becomes to change little by little. Even when the amplitude of the disturbance signal changes, the zero-cross point moves. Accordingly, the frequency F(t) in the equation (1) is modulated by a pulse width modulation (PWM) by the amplitude and phase of the disturbance signal.

In many cases, the bias current Ice is set to be a value larger than the high-frequency signal current Irf. The product of F(t) and Iee appears in an output Vout(t). In a homodyne receiver system in which output of the frequency converter is supplied to a low-pass filter, since the PWM signal is demodulated by the low-pass filter, these noises remarkably appear. Further, also in a heterodyne receiver system in which the output of the frequency converter is supplied to a bandpass filter, since the output (intermediate frequency) of the converter is set to a lower frequency of the order of one tenth (1/10) of the input high-frequency signal and the local oscillation signal in many cases, there is transmitted a noise component of a frequency oil-set by a value from twice greater than the frequency of the local oscillation signal to one twentieth (1/20) thereof to the output by the PWM modulation.

On the other hand, the disturbance signal having a frequency three times greater than that of the local oscillation signal, as shown In FIG. 3, is modulated by a pulse phase modulation and not by the PWM because the zero-cross point (shown by the symbol ○ or ⊙ in the figure) moves in a substantially in parallel direction. Since the low-pass filter does not demodulate the pulse phase modulation signal, a noise component of a frequency three times greater than that of the local oscillation signal hardly has influence to the output.

This is not a phenomenon limited to a frequency twice or thrice greater than that of the local oscillation signal- A frequency which is multiple of even number including a multiple of zero of the local oscillation signal, appears in the output by the pulse width modulation. However, a frequency which is a multiple of odd number of the frequency of the local oscillation signal is not modulated because noise of multiple of the odd number is transmitted as the pulse phase modulated signal.

Here, the frequency which is multiple of zero of the frequency of the local oscillation signal is an alternative current waveform of a low frequency substantially close to a direct current, and is a frequency of the degree of a value less than one tenth (1/10) of the local oscillation frequency. In the case where the direct current as the disturbance signal is superposed on the local oscillation signal, a duty ratio of F(t) changes in correspondence with a very small amplitude near the direct current. For example, in a personal handy-phone (portable telephone) system —PHS—, since the receiver receives a high-frequency signal of 1.9 GHz, a local oscillation signal of 1.9 GHz is used in the homodyne receiver system. Even though a frequency which is multiple of zero greater than the local oscillation signal is substantially the direct current, a noise component of 50 kHz can be regarded as a disturbance signal having a frequency deviating by 50 kHz from that multiple of zero of the local oscillation signal. The noise component of multiple of zero appears in the output in a form of the PWM signal in the same manner as that in the case of a noise component having a frequency deviating by 50 kHz from a value two times greater than the local oscillation signal, namely, a noise component of 3.80005 GHz. Thus, such noise component is inputted to a channel selection filter. Since the channel selection filter has a low-pass characteristic of a cut-off frequency equal to or less than 150 kHz, the PWM signal is demodulated.

Since an electronic circuit necessarily has a parasitic capacitance, the higher the frequency becomes, the lower the noises are. Accordingly, noise having a frequency near the direct current give the largest influence on the output, and larger influence occurs in noises having a frequency near two times as large as the local oscillation frequency.

SUMMARY OF THE INVENTION

As described above, the present invention is done in view of the problem that noises having a frequency which is substantially multiple of even-number of the local oscillation frequency inputted into a multiplication circuit in the stare superposed in the local oscillation signal cause a signal quality to be deteriorated, and an object of the present invention is to provide a frequency converter capable of reducing noises giving a remarkably bad influence on a signal quality.

In order to resolve the above problem, a frequency converter according to the present invention comprises a high-frequency signal input circuit for adding an input high-frequency signal with a bias voltage or current to output a bias-added high-frequency signal, a local oscillation signal input circuit for adding an input local. oscillation signal with a bias voltage or current to output a bias-added local oscillation signal, and a multiplication circuit for multiplying the bins-added high-frequency signal by the bias-added local oscillation signal to output a product of both signals, wherein the local oscillation signal input circuit further comprises even harmonic suppression means for suppressing a noise component having a frequency which is substantially multiple of even-number of a frequency of the local oscillation signal.

Furthermore, the local oscillation signal input circuit according to the present invention may be constituted so that an output impedance in a low-frequency has the characteristic that it becomes a value smaller than an output impedance in a frequency of a local oscillation signal, that is, noises having a frequency which is substantially multiple of zero of the frequency of the local oscillation signal should be reduced Still furthermore, the frequency converter according to the present invention may be installed in radio receiver system including a receiving apparatus for outputting reception data after demodulating a base band signal which has been obtained by a frequency converter section that converts a frequency of a high-frequency signal received by receiving section including an antenna on the basis of a local oscillation signal having a frequency substantially equal to that of the high-frequency signal, and the frequency converter section may comprise a high-frequency signal input circuit, a local oscillation signal input circuit including even harmonic suppression means for suppressing a noise component having a frequency which is multiple of even number of the local oscillation signal, and a multiplication circuit for multiplying an output signal of the high-frequency input circuit by en output signal of the local oscillation input circuit.

According to the present invention, it is possible to realize a low-noise frequency converter. When the frequency converter is installed in a radio receiver set having a spurious and low-cost local oscillator, it is possible to reduce a deterioration of a signal in the frequency converter. Since a necessary gain becomes low in a high-frequency amplifier circuit in order to obtain a constant signal-noise ratio (S/N) even when change of noise in input becomes lower, it is possible to reduce a current consumption of the high-frequency amplifier circuit. Therefore, since it is possible to reduce a current consumption of the whole radio receiver set, the frequency converter of the present invention is suitable for a portable telephone terminal equipment.

As has been described above, the present invention can provide a frequency converter having low noises, end it is possible to simplify a high-frequency amplifier circuit when a low-noise frequency converter according to the present invention is used.

Furthermore, since a frequency in a pseudo-micrometer wave band is allotted in a mobile communication system and since an resonant circuit of pseudo-micrometer wave band can be integrated comparatively easily, it is possible to realize the frequency converter according to the present invention as an integrated circuit (IC). Accordingly, the frequency converter according to the present invention is suitable for various portable communication terminal equipments for which a small size and a light weight are required.

BRIEF DESCRIPTION OF THE DRAWINGS

In the accompanying drawings:

FIG. 14 is a circuit diagram showing a frequency converter according to a ninth embodiment of the present invention;

FIG. 18 is a block diagram showing a receiver system according to a thirteenth embodiment of the present invention.

DETAILED DESCRIPTION OF THE PREFERRED EMBODIMENTS

There will be described in detail preferred embodiments of a frequency converter according to the present invention with reference to the attached drawings.

Figure 1:
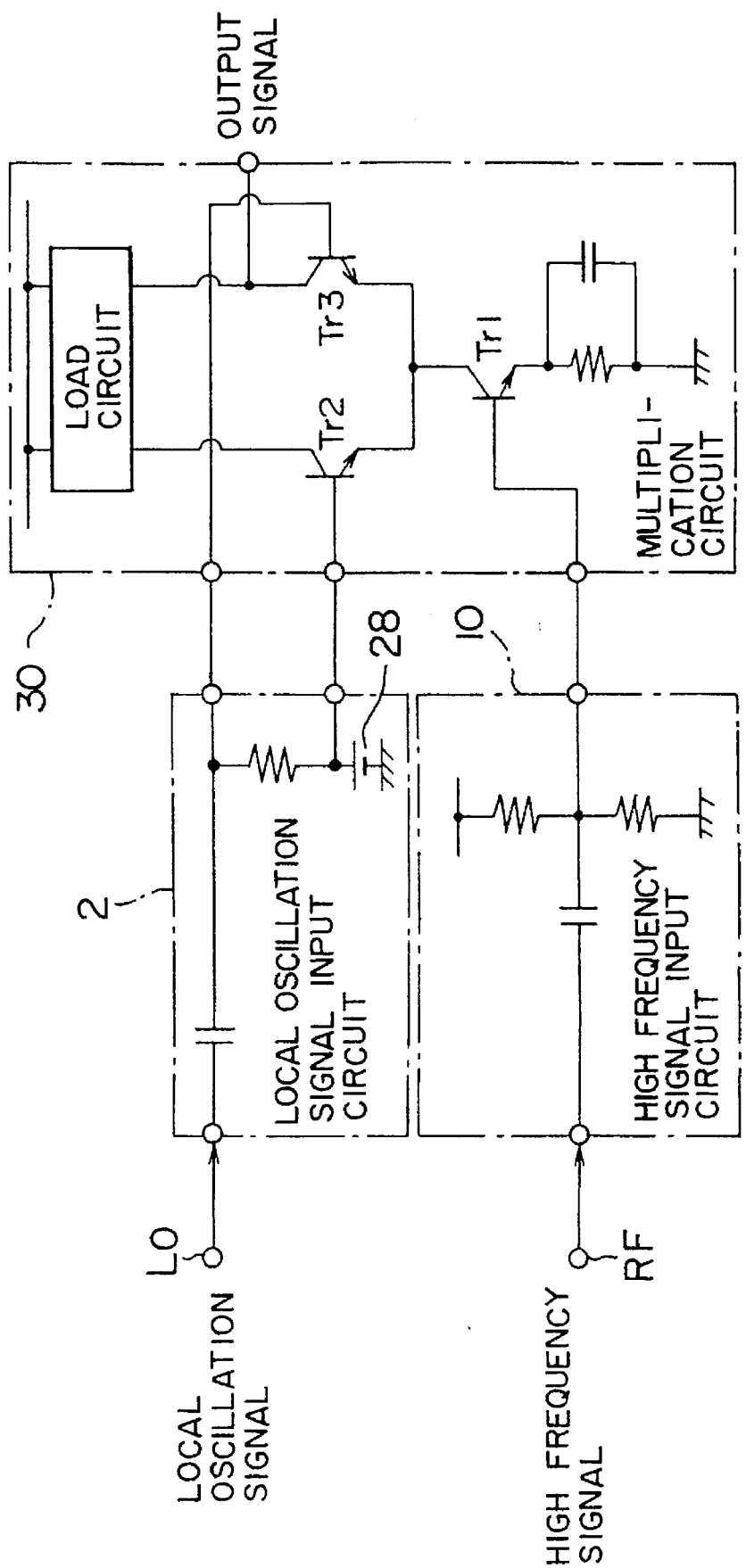
FIG. 1 is a circuit diagram showing a schematic configuration of the conventional frequency converter.
Figure 2:
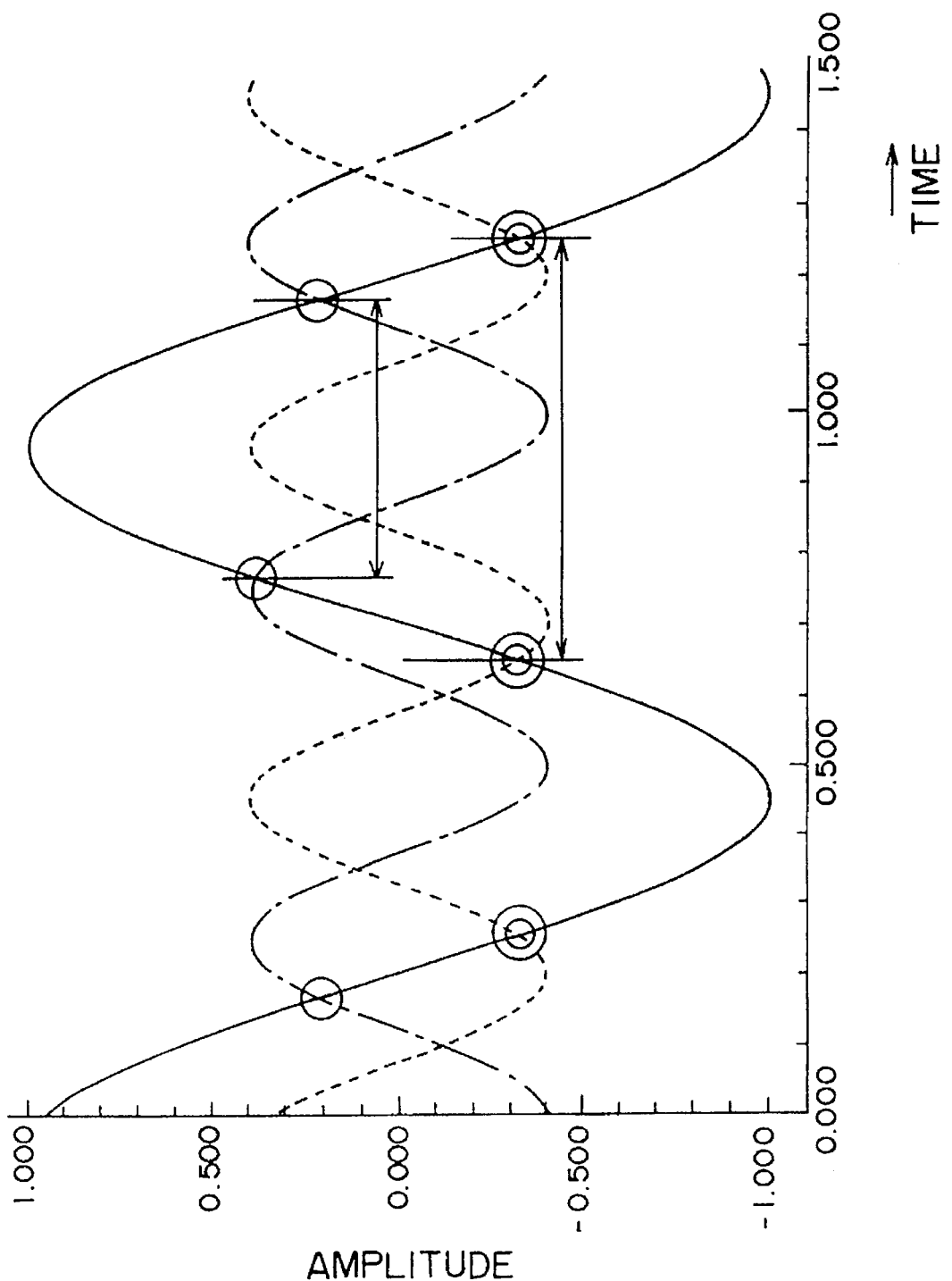
FIG. 2 is a characteristic diagram showing a noise component which is multiple of even number of local oscillation frequency.
Figure 3:
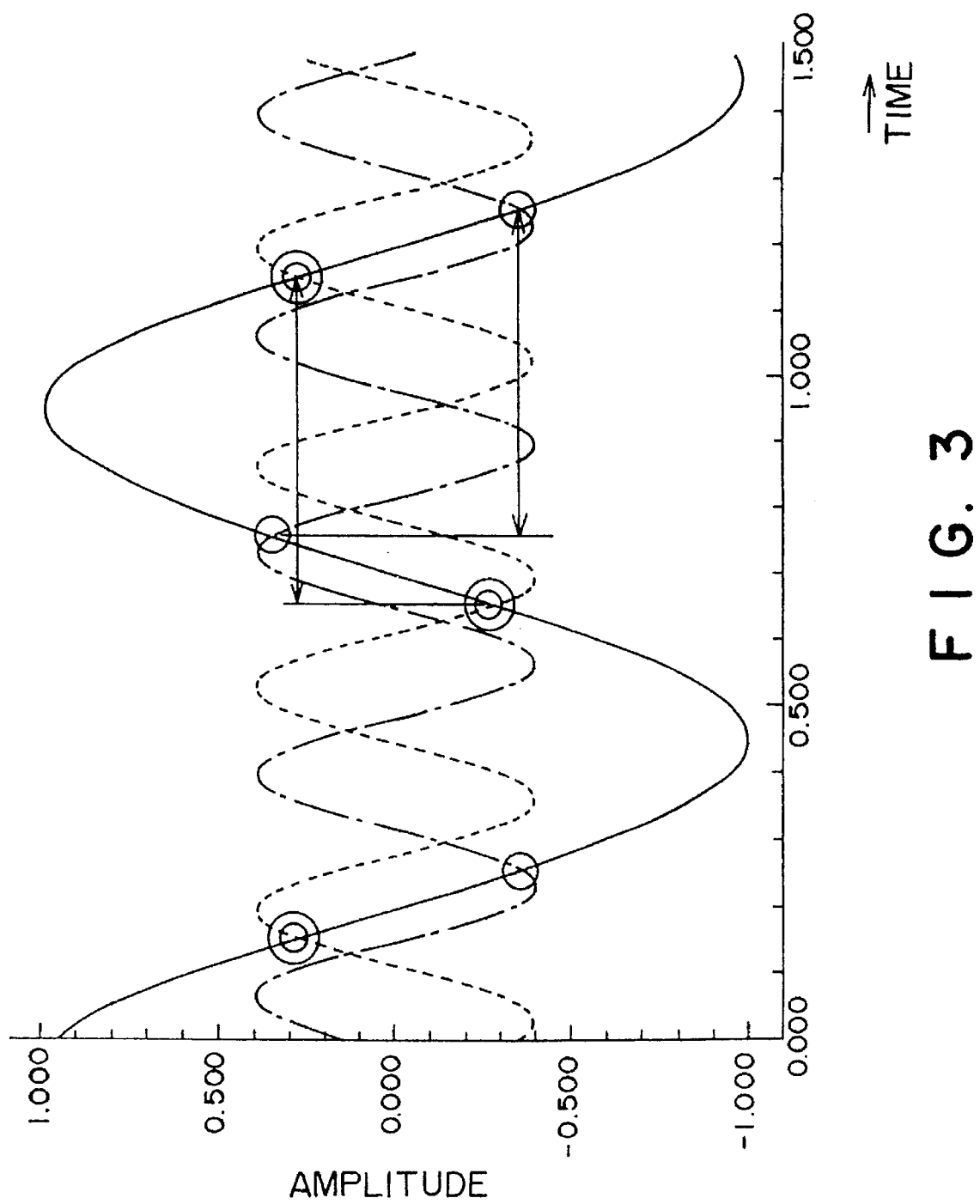
FIG. 3 is a characteristic diagram showing a noise component which is multiple of odd number of local oscillation frequency.
Figure 4:
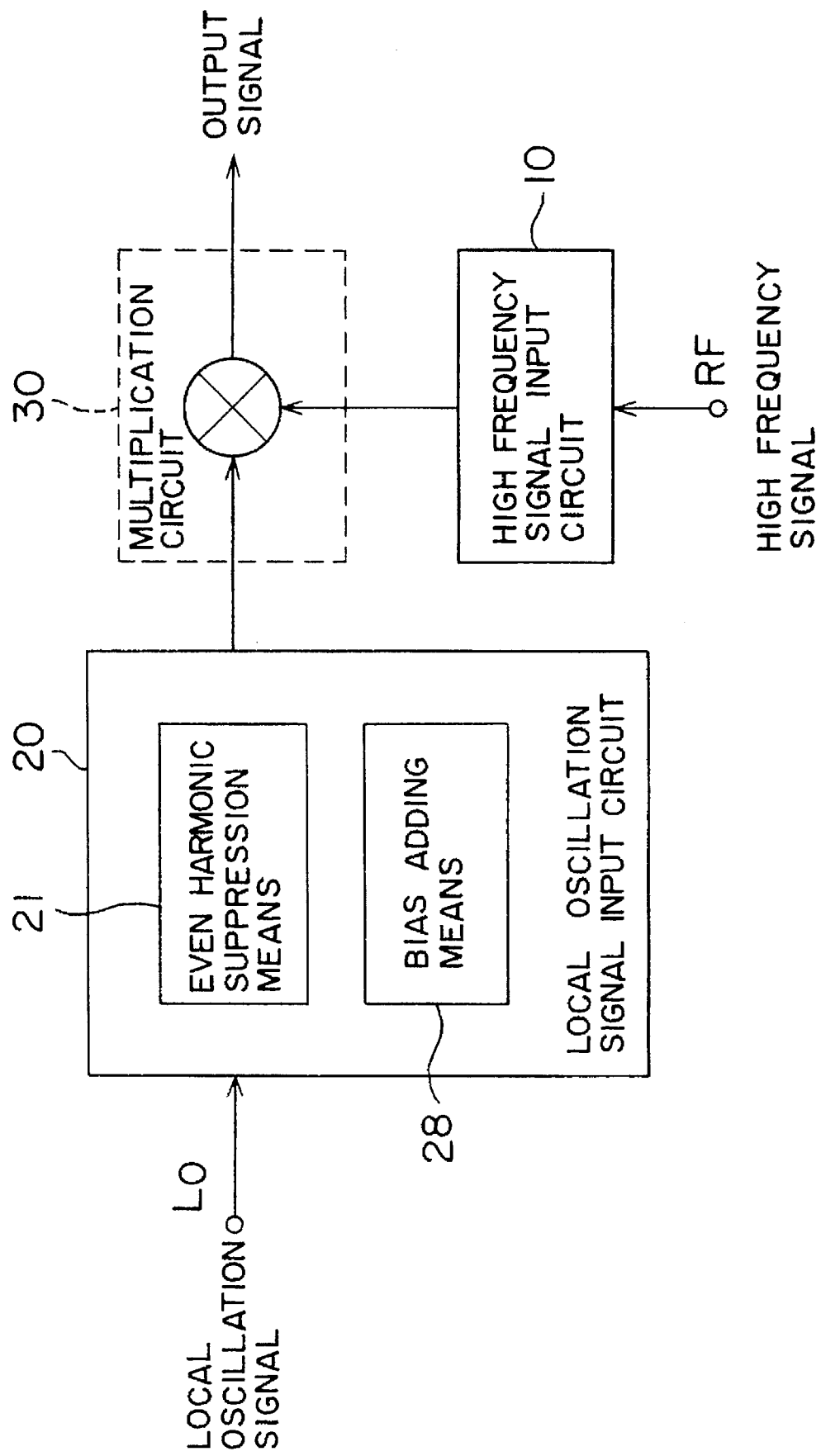
FIG. 4 is a block diagram showing the basic concept of a frequency converter according to this invention.

FIG. 4 is a block diagram showing a basic concept of the frequency converter according to the present invention. In the figure, the frequency converter comprises high-frequency input circuit 10 to which a high-frequency signal is inputted, a local oscillation signal input circuit 20 to which a local oscillation signal is inputted, and multiplication circuit 30 for multiplying an output of the high-frequency input circuit 10 by an output of the local oscillation signal input circuit 20. The local oscillation signal input circuit 20 comprises even harmonic suppression means 21 for suppressing noises having frequency component which is multiple of even number of a fundamental frequency of the local oscillation signal.

Figure 5:
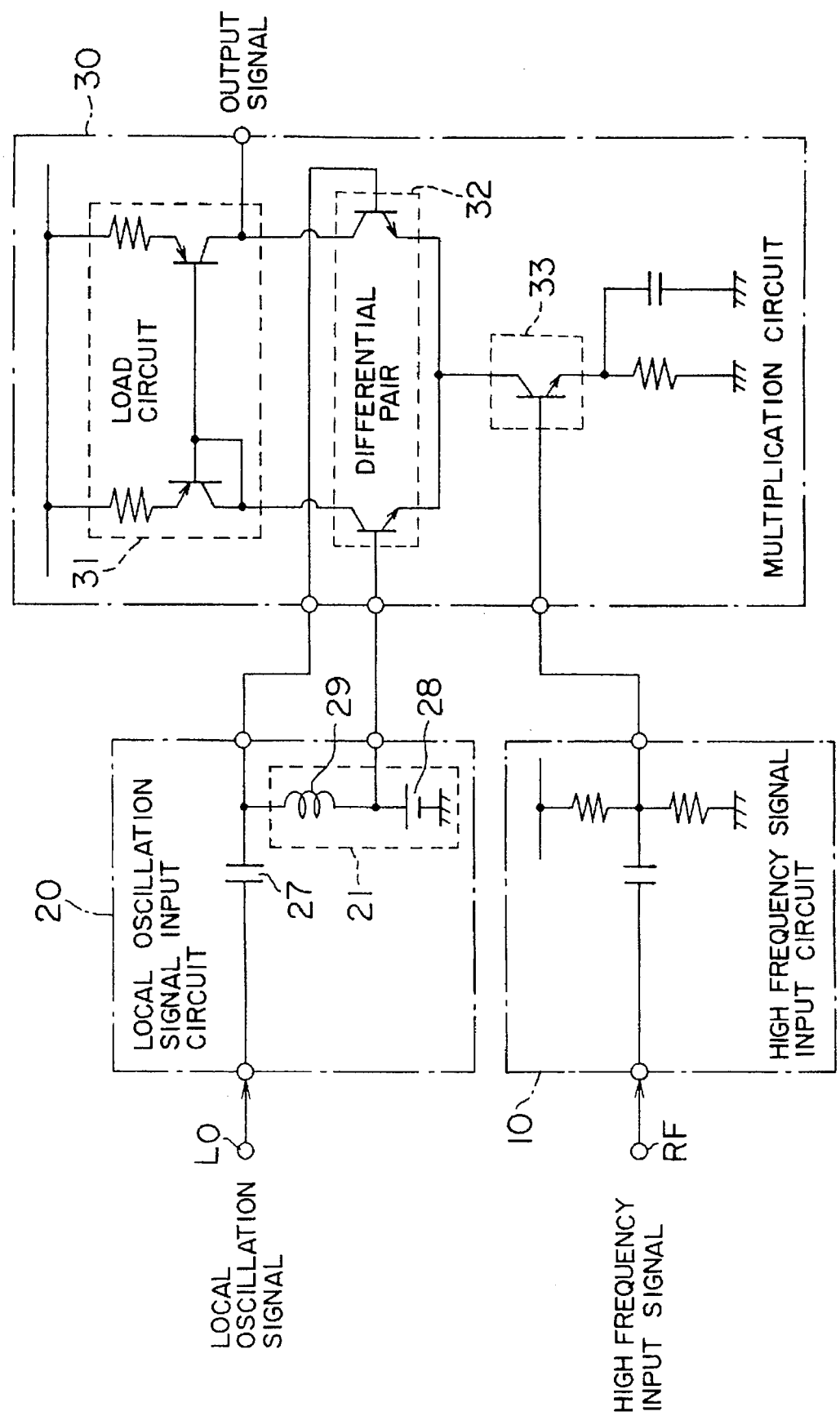
FIG. 5 is a circuit diagram showing a frequency converter according to a first embodiment of the present invention.

FIG. 5 is a circuit diagram showing a detailed configuration of the frequency converter according to the first embodiment. The local oscillation signal input circuit 20 comprises a bias voltage source, en inductor 29, end a capacitor 27, which applies a bias potential to the multiplication circuit 30. Since the input circuit 20 has the even harmonic suppression means 21, an output impedance of the local oscillation signal input circuit 20 is small in a low frequency region in comparison with a local oscillation frequency, thereby suppressing a low-frequency noise occurring in the local oscillator (not shown) so as not to supply noises to the multiplication circuit Because meaning of "frequency of multiple of even number of the local oscillation frequency" includes multiple zero, and because it is possible to grasp the noise components having a frequency multiple of zero of the local oscillation frequency as a low-frequency noise.

Furthermore, even though a local oscillation signal is supplied to the multiplication circuit 30 by the characteristic of coil, since the low-frequency noises are delivered to the bias voltage source through a low impedance element (coil), the noises are not inputted into the multiplication circuit 30. The even harmonic suppression means 21 comprises the inductor 29. The high-frequency signal input circuit 10 includes a capacitor and a voltage dividing resistor for dividing a supplied voltage. The multiplication circuit 30 comprises a load circuit 31, a transistor differential pair 32 as a switch for changing over plus and minus components in a bias-added local oscillation signal, and an amplifier circuit 33 for amplifying a bias-added high-frequency signal.

Figure 6:
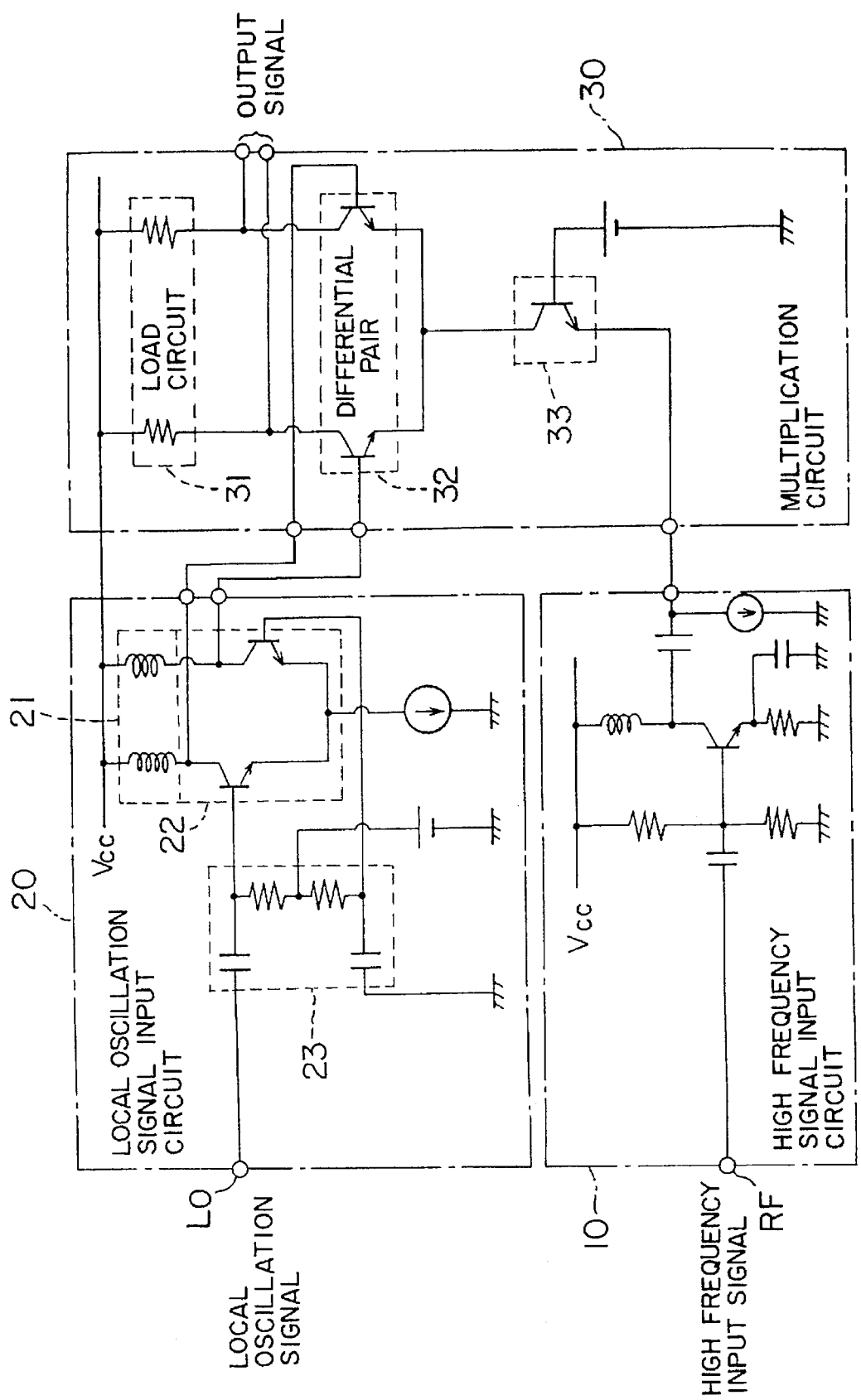
FIG. 6 is a circuit diagram showing a frequency converter according to a second embodiment of the present invention.

FIG. 6 is a circuit diagram showing a configuration of a frequency converter according to a second embodiment. In the figure, the local oscillation signal is amplified by a differential amplifier circuit 22 provided in the local oscillation signal input circuit 20. Since an output of the amplifier circuit 22 is connected to an inductor as the even harmonic noise suppression means 21, noise components having a low frequency are not amplified even though the local oscillation signal is amplified. As described above, not only an external noise component is suppressed, but also it is possible to suppress an internal noise component such as a thermal noise or shot noise, which is generated by each element provided in the local oscillation signal input circuit 20.

Furthermore, in FIG. 6, an impedance matching circuit 23 is provided between the amplifier circuit 22 and an input terminal of the local oscillation signal so as to suppress a reflected wave of the local oscillation signal by establishing matching between a line impedance and an input impedance of the local oscillation signal.

Figure 7:
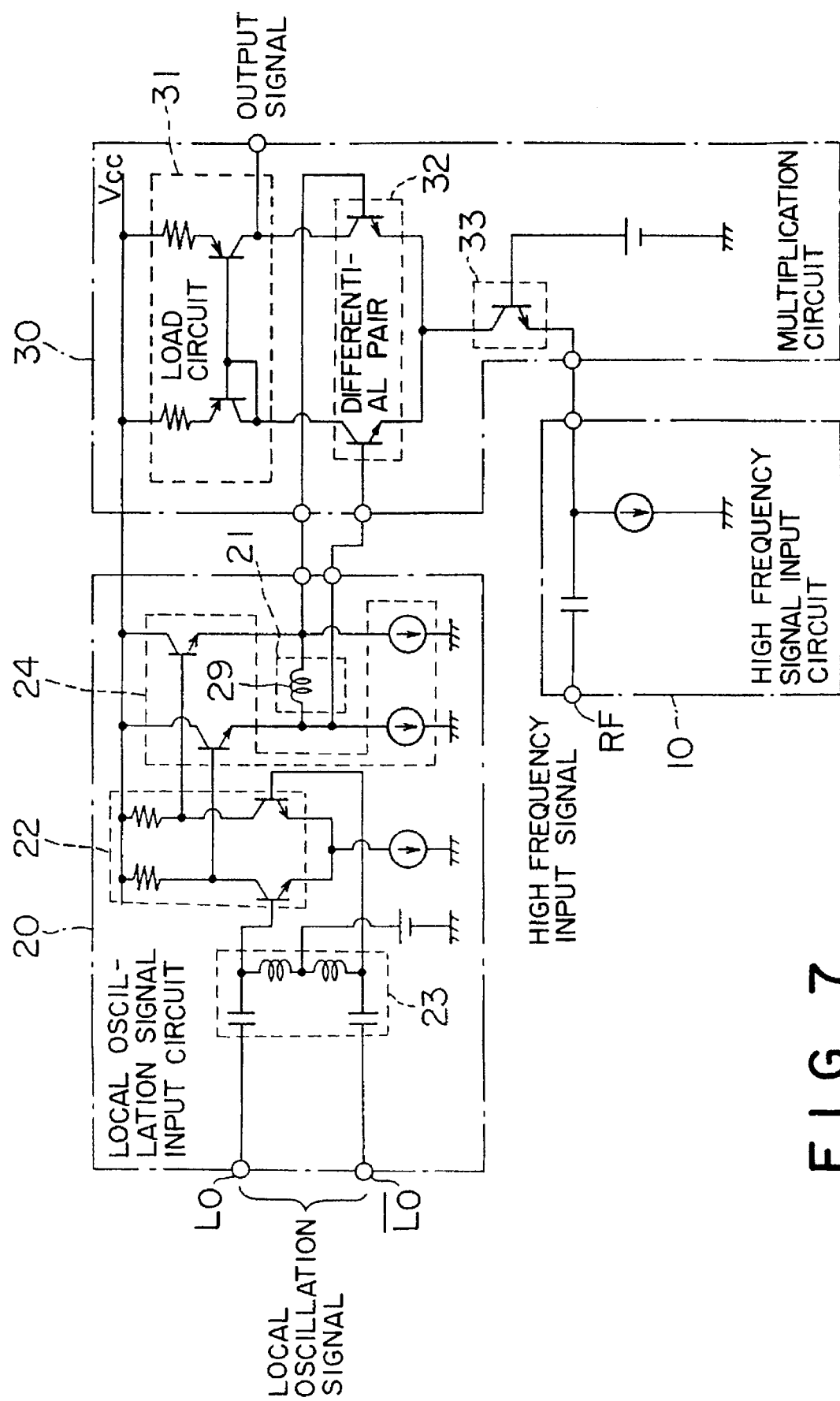
FIG. 7 is a circuit diagram showing a frequency converter according to a third embodiment of the present invention.

FIG. 7 is a circuit diagram showing a configuration of the frequency converter according to a third embodiment. In the figure, even though the local oscillation signal input circuit 20 comprises differential amplifier circuit 22 and an emitter-follower circuit 24, it is possible to suppress a low-frequency noise because differential outputs of the emitter-follower circuit 24 are connected through inductor 29 as the even harmonic suppression means 21.

Figure 8:
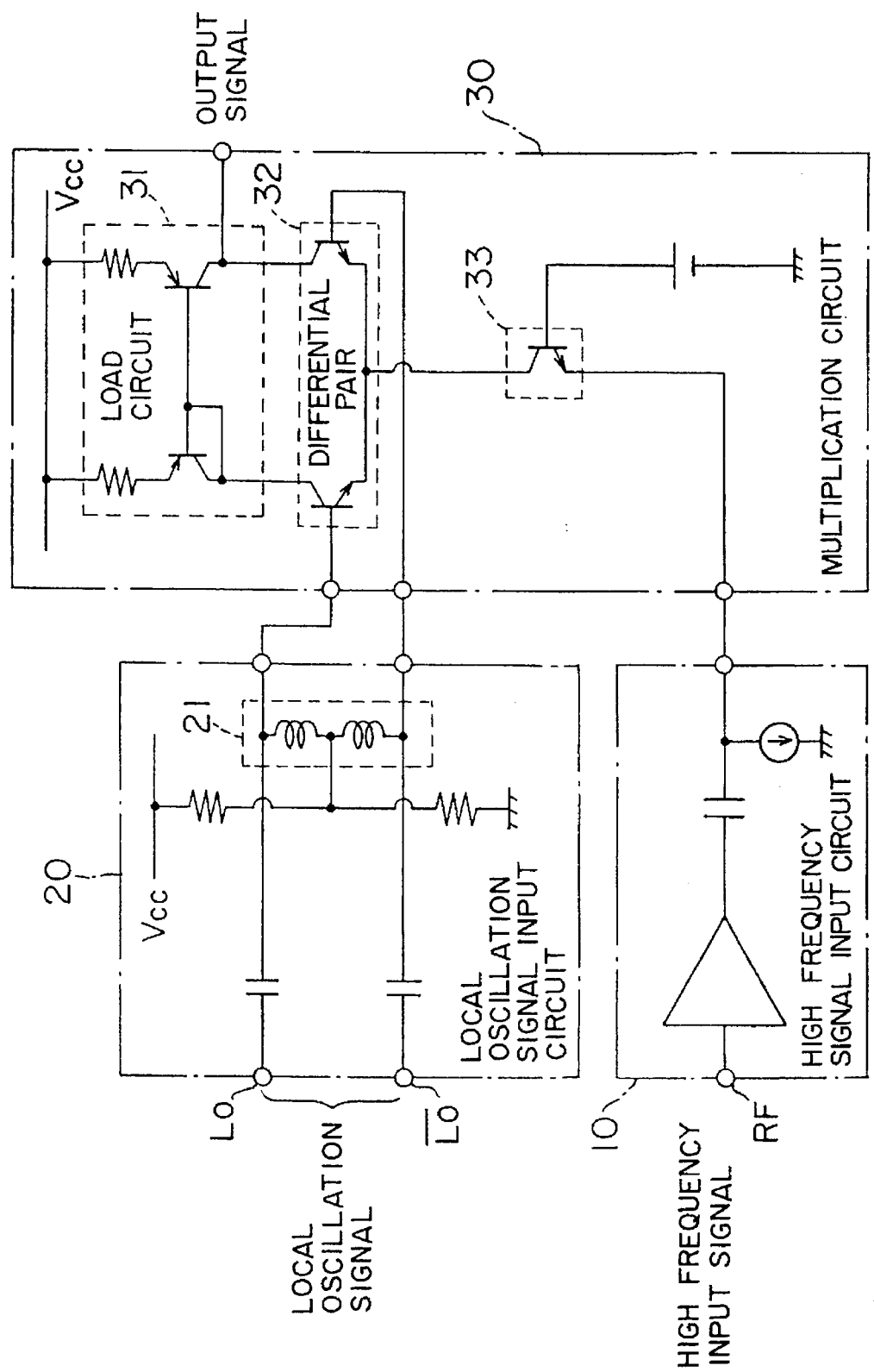
FIG. 8 is a circuit diagram showing a frequency converter according to a fourth embodiment of the present invention.

The local oscillation signal input circuit 20 according to the third embodiment comprises en impedance matching circuit 23, the differential amplifier circuit 22, the emitter-follower circuit 24, and the inductor as the even harmonic noise suppression means 21. The impedance matching circuit 23 has a main object to march an impedance between the output impedance of the local oscillation circuit or The line impedance of a transmission line with the input impedance of the differential amplifier circuit, also has a band pass characteristic for suppressing signals having other frequencies because the circuit 23 performs a matching at the local oscillation frequency. Accordingly, even though the matching circuit 23 is required to have an effect for suppressing the even harmonic wave noises, it is impossible for only the matching circuit 23 to expect an effect for suppressing the noises occurring in the differential amplifier circuit 22 and the emitter-follower circuit 24. It is possible to suppress the noises flowing into the multiplication circuit 30 by a connection of the inductor as the even harmonic suppression means 21 between both the outputs of the emitter-follower circuit 24 in addition to the matching circuit FIG. 8 is a circuit diagram showing a frequency converter according to a fourth embodiment of the present invention. Since a bias voltage or current is supplied through the inductor as the even harmonic suppression means 21 to base terminals of both transistors constituting a differential pair 33 provided in the multiplication circuit 30, the low-frequency noise can be suppressed before supplying to the multiplication circuit 30. Even though values of two capacitors end inductor as the noise suppression means 21 can exhibit a function as the impedance matching circuit, the local oscillation signal input circuit 20 according to the present invention has a excellent function that the inductor can extremely suppress the low-frequency noises.

Figure 9:
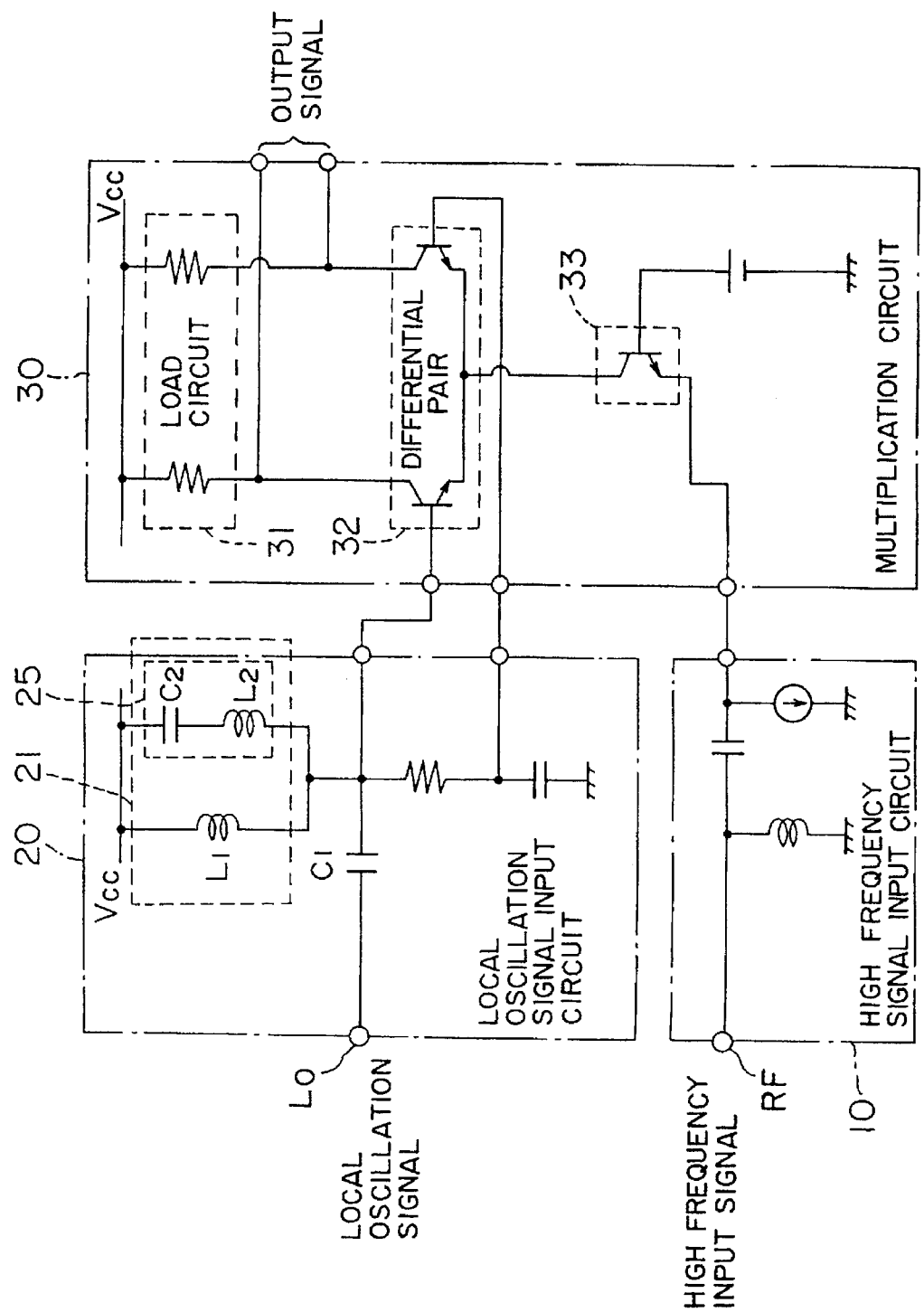
FIG. 9 is a circuit diagram showing a frequency converter according to a fifth embodiment of the present invention.

FIG. 9 is a circuit diagram showing a frequency converter according to a fifth embodiment of the present invention. The frequency converter has a circuitry comprising a series resonance circuit 25 comprised of an inductor L2 end a capacitor C2 in order to further suppress noises having a frequency substantially two time greater than the local oscillation frequency in addition to the low-frequency. Since the inductor L2 and capacitor C2 constitute the series resonance circuit for resonating to the frequency substantially two times greater then the local oscillation frequency, an impedance becomes lower at a frequency near the frequency two times greater than the local oscillation frequency region. An inductor L1 makes an impedance lower in the low-frequency. On the other hand, since the inductors L1 and L2 and capacitor C2 perform a parallel resonance in the local oscillation frequency, an impedance becomes higher, thereby causing an input voltage of the multiplication circuit 30 to have only the local oscillation frequency. Accordingly, since the circuit has a low impedance even in the low-frequency region, it is possible to suppress both the low-frequency noises end noises having a frequency near the frequency two times greater than the local oscillation frequency at the same time.

Figure 10:
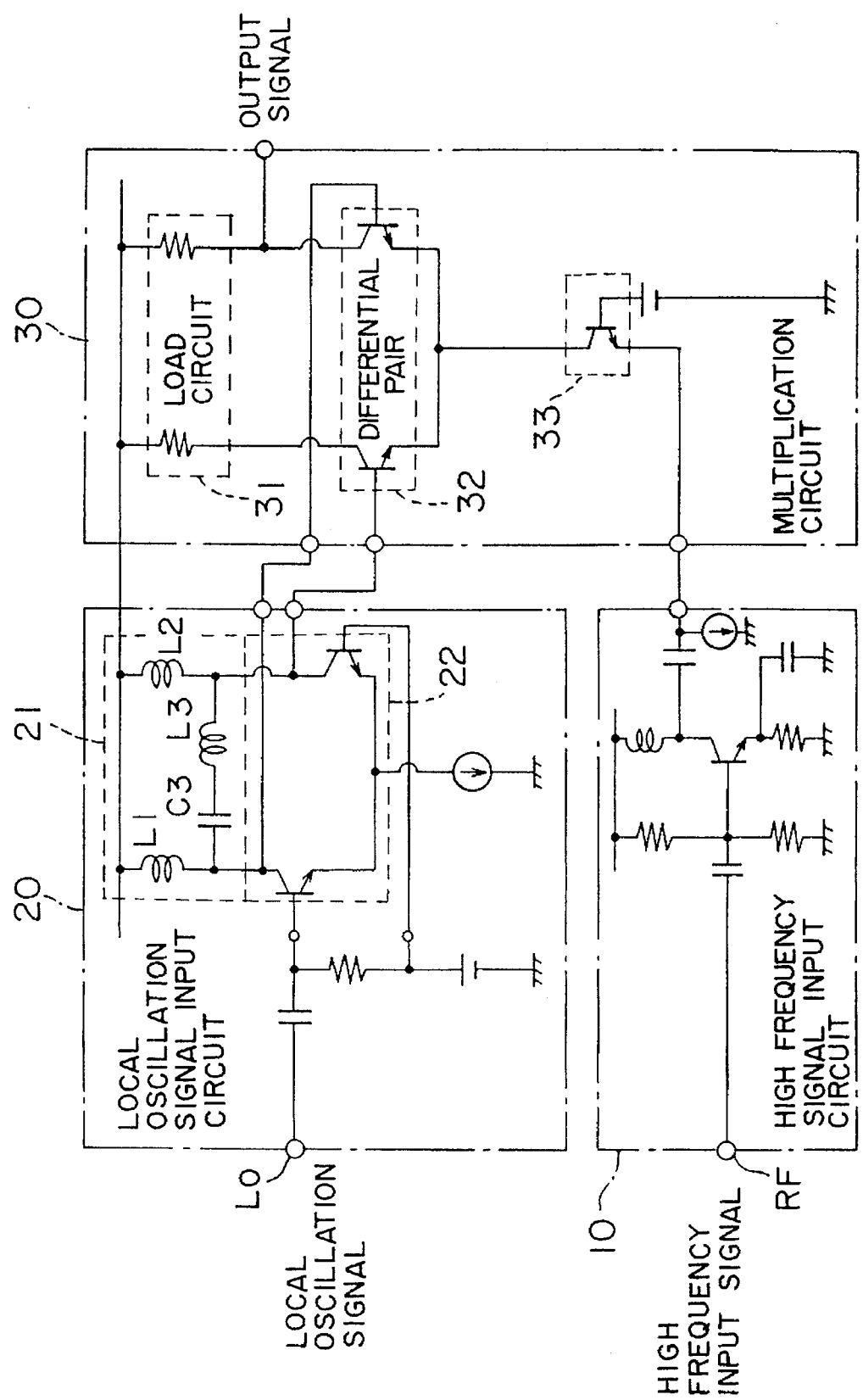
FIG. 10 is a circuit diagram showing a frequency converter according to a sixth embodiment of the present invention.

FIG. 10 is a circuit diagram showing a configuration of a frequency converter according to a sixth embodiment of the present invention. Since the even harmonic suppression means 21 is provided before the output of the local oscillation signal input circuit 20 and comprises inductors L1 and L2 and a parallel resonance circuit L3 and C3, it is possible to suppress the low-frequency noises and the noises having a frequency near the frequency two times greater than the local oscillation frequency. At the same time, it is possible to obtain a high gain by resonating the inductors L1, L2 and L3 and the capacitor C3 at the local oscillation frequency.

Figure 11:
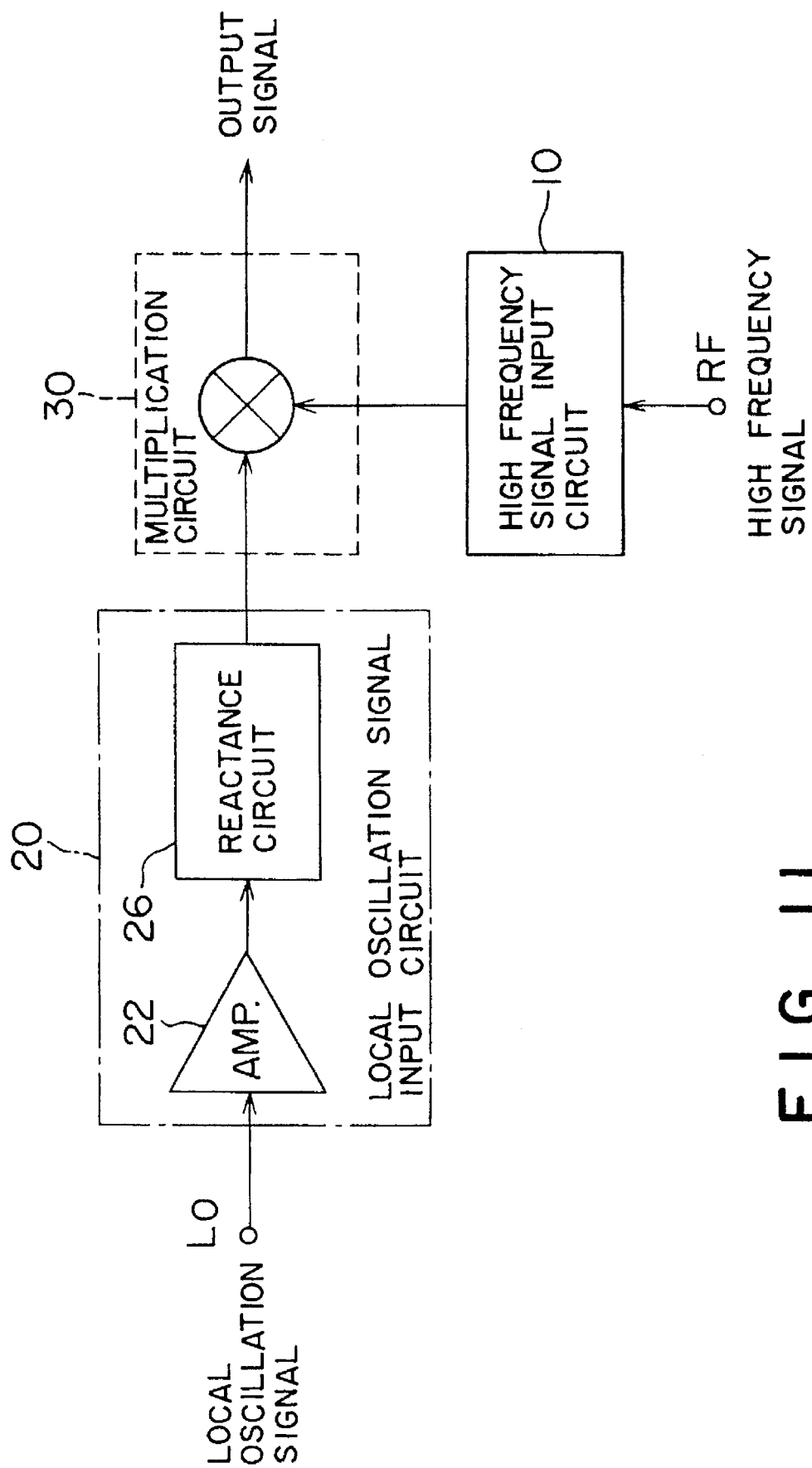
FIG. 11 is a block diagram showing a frequency converter according to a seventh embodiment of the present invention.

FIG. 11 is a block diagram showing a frequency converter according to a seventh embodiment of the present invention.

In the converter shown in the figure, the local oscillation signal is amplified by amplifier circuit 22 in local oscillation signal input circuit 20, end supplied to multiplication circuit 30 after the noises having a frequency near the frequency which is multiple of even number of the local oscillation frequency is suppressed by a reactance circuit 26. The reactance circuit 26 can be realized by connecting a short stub having a quarter wavelength, for example.

Figure 12:
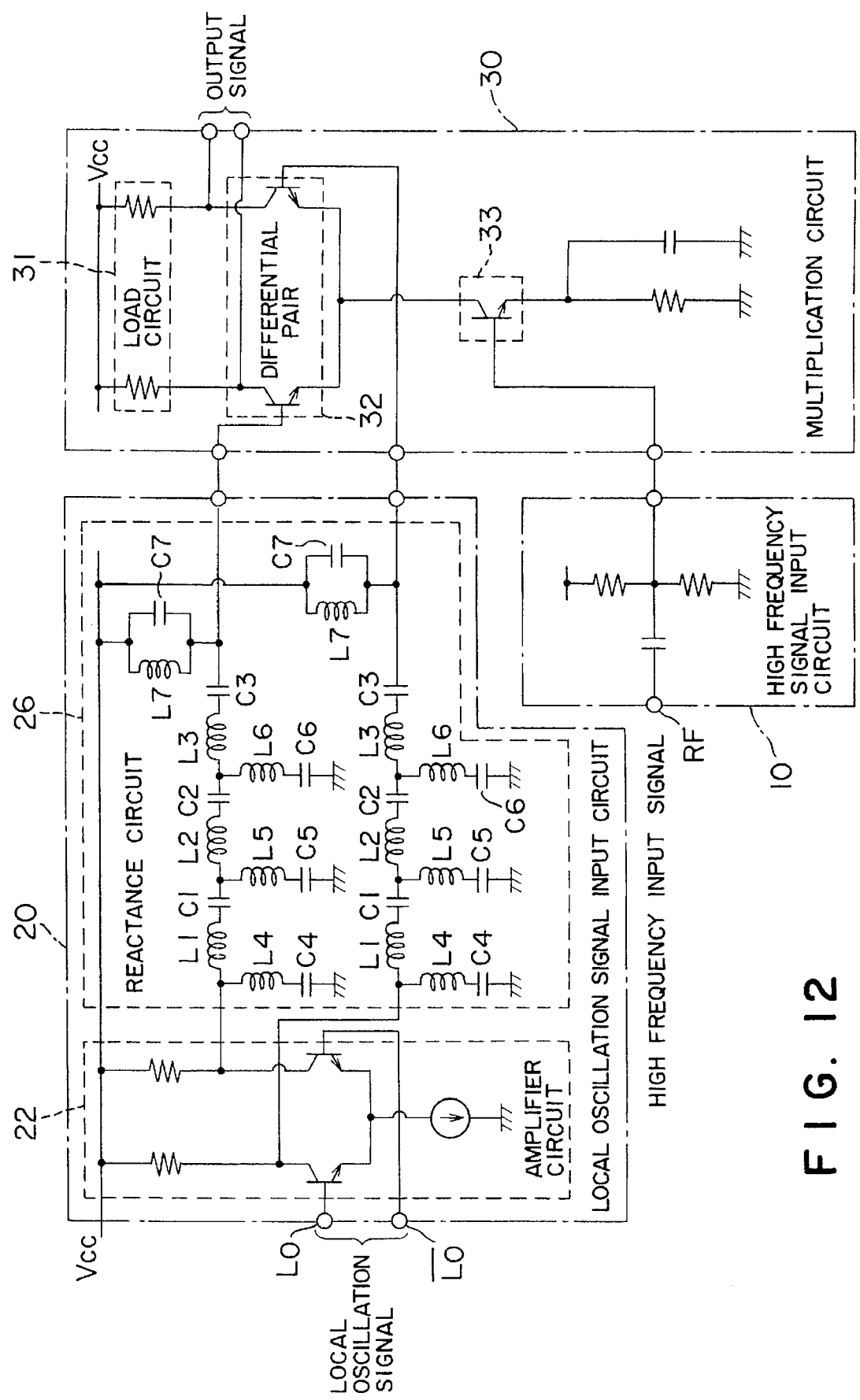
FIG. 12 is a circuit diagram showing a frequency converter according to an eighth embodiment of the present invention.
Figure 13:
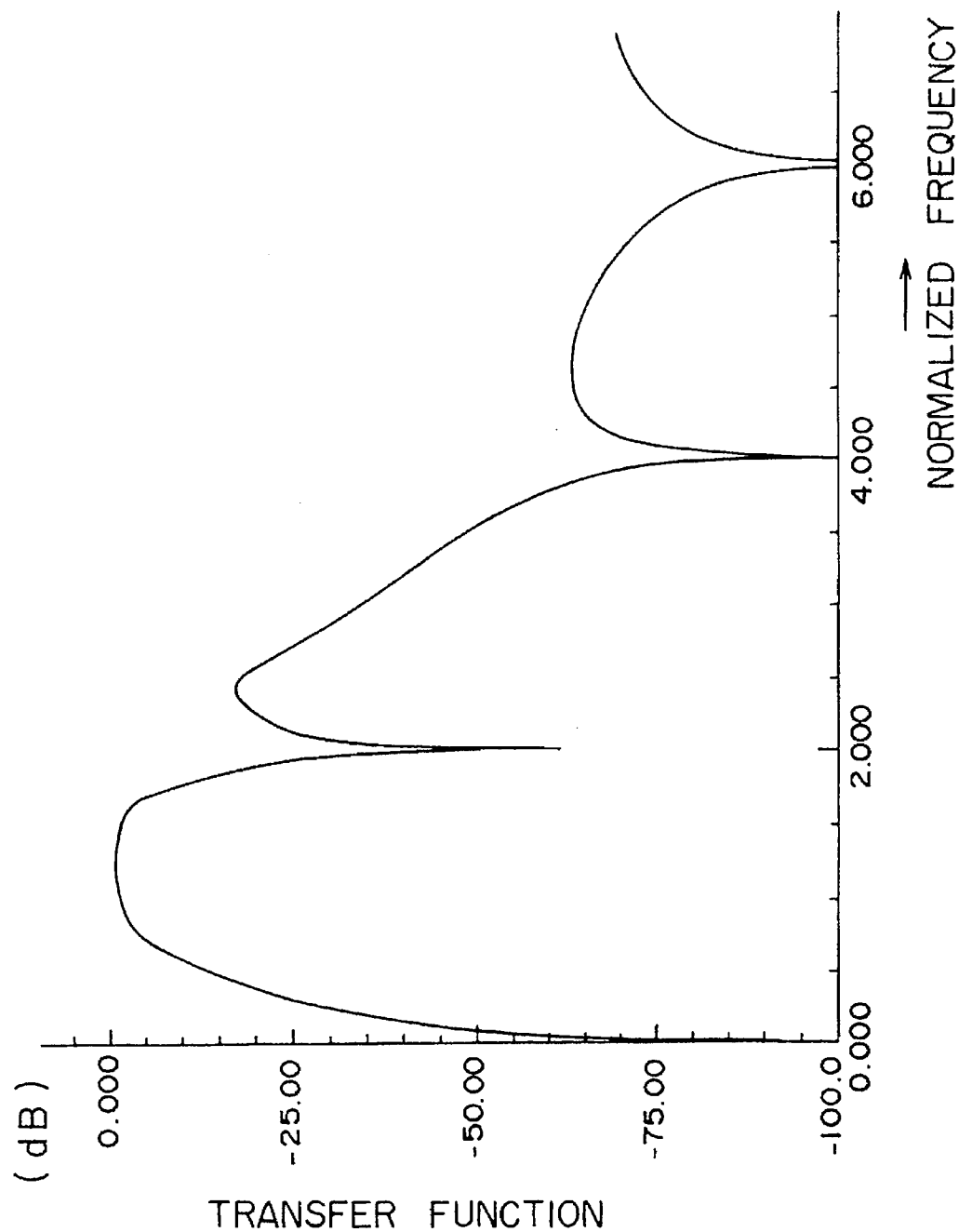
FIG. 13 is a graph showing a transfer or characteristic of the circuit in the frequency converter according to the eighth embodiment of the present invention.

FIG. 12 is a circuit diagram showing a frequency converter according to an eighth embodiment as a detailed constructual example of a reactance circuit, which is a ladder-type filter. In the ladder-type filter, inductors L1, L2 and L3 respectively resonate in series with capacitors C1, C2 and C3 at the local oscillation frequency, inductors L4, L5 and L6 respectively resonate in series with capacitors C4, C5 and C6 at frequencies two, four and six times greater than the local oscillation frequency, respectively, and an inductor L7 resonates in parallel with a capacitor C7 at the local oscillation frequency. FIG. 13 shows a correlation between a transfer function represented on the ordinate and normalized frequencies represented on the abscissa. Here, the normalized frequencies mean values in which a predetermined frequency is divided by the local oscillation frequency, and the predetermined frequency of a signal is several times greater than the local oscillation frequency. The normalized frequencies have a characteristic having notches at frequency value of multiple of even number of the local oscillation frequency, thereby resulting an effect for suppressing the noises of frequency of multiple of even number of the local oscillation frequency.

FIG. 14 is a circuit diagram showing a frequency converter according to a ninth embodiment as another constructual example of the reactance circuit. In this embodiment, it is possible to suppress the noises by a series resonance circuit which resonates in series with a frequency multiple of even number of the frequency of the local oscillation signal and which is connected in parallel with both outputs of the local oscillation input circuit 20.

Figure 15:
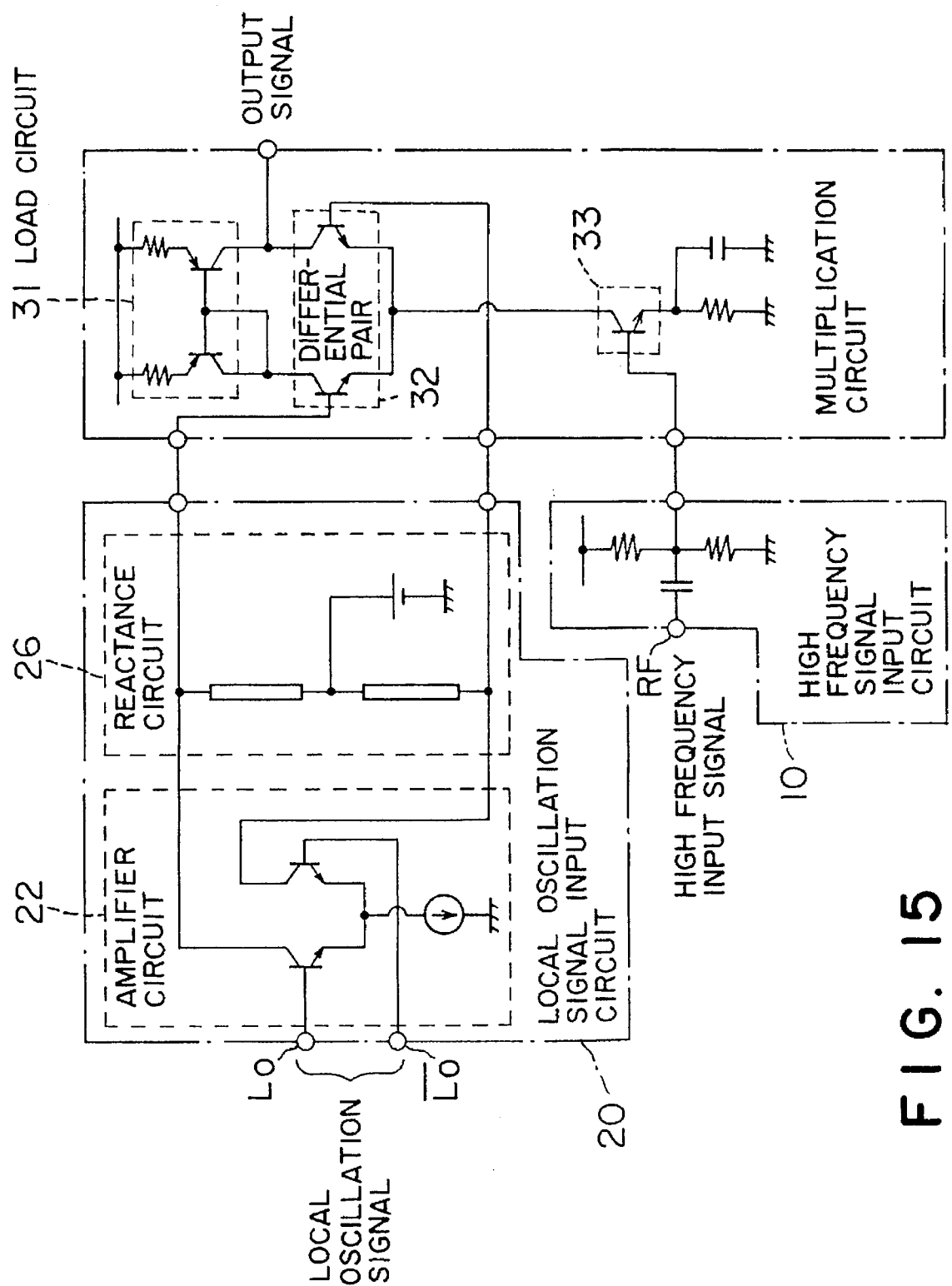
FIG. 15 is a circuit diagram showing a frequency converter according to a tenth embodiment of the present invention.

FIG. 15 is a circuit diagram showing a frequency converter according to a tenth embodiment as still further constructual example of the reactance circuit. In the figure, a reactance circuit 26 comprises a pair of transmission lines of a quarter-wavelength short stub, and a voltage reference source which is connected with a junction point between the pair of lines. According to the configuration, it is possible to suppress noise components of frequencies multiple of zero, two, four and six of a fundamental frequency of the local oscillation signal as shown in FIG. 13, respectively.

Even though all of the frequency converters according to the first through the ninth embodiments use a single balance multiplication circuit, it is expected that the present invention can exhibit a larger effect by applying a double balance multiplication circuit.

Figure 16:
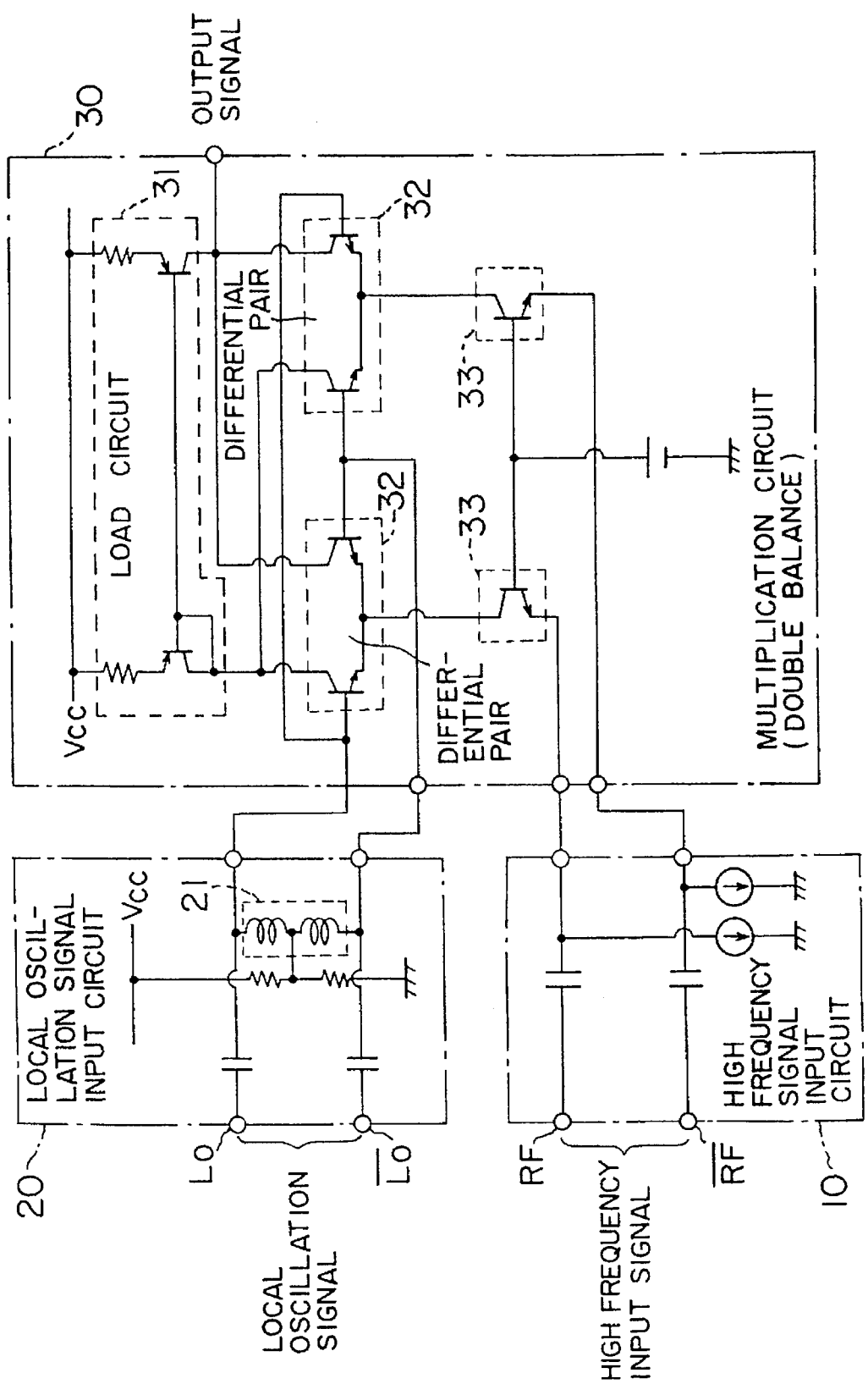
FIG. 16 is a circuit diagram showing a frequency converter according to an eleventh embodiment of the present invention.

FIG. 16 is a circuit diagram showing a frequency converter according to an eleventh embodiment as a concrete example of a double balance multiplication circuit. The frequency converter according to the eleventh embodiment uses a multiplication circuit 30 of a double balance type, in which two single balance multiplication circuits are combined with each other in such a manner that respective outputs of the single circuits are cancelled, so that an equation of an output can be represented by the following equation (2) which takes a form of subtraction of the equation (1): namely, $$\text{Vout}(t)=K{\times}F(t){\times}\{Irf1(t)+Iee1\}-K{\times}F(t){\times}\{Irf2(t)+Iee2\} \quad (2)$$

where, the equation (2) can be represented by the following equation (3):

$$V_{out}(t)=K \times F(t) \times \{(Irf1(t)-Irf2(t))+(Iee1-Iee2)\} \quad (3).$$

Since Iee1 is caused to be equal to Iee2 in a design, the double balance multiplication circuit has as an output a differential component between F(t) and the high-frequency input, namely, the product of "Irf1(t)-Irf2" and does not have as an output a pulse width modulated signal caused from a product of F(t) and Ice such as the single balance multiplication circuit. However, since the actual circuit has an error, Iee1 and Iee2 do not cancel completely each other, thereby resulting an appearance as a pulse width modulated signal the product of F(t) and an error component "Iee1-Iee2" included in an output. Accordingly, even though the use of the double balance multiplication circuit can reduce influence of noises of a frequency which is multiple of even number of the local oscillation frequency, it is possible to further reduce the noises by removing the low-frequency noises by the local oscillation signal input circuit using inductors shown in FIG. 16. Furthermore, the noise suppression effect can improve more and more by means of a combination of the double balance type multiplication circuit and the local oscillation signal input circuit including the reactance circuit for suppressing the noise Component having a frequency which is multiple of even-number of the local oscillation frequency.

Figure 17:
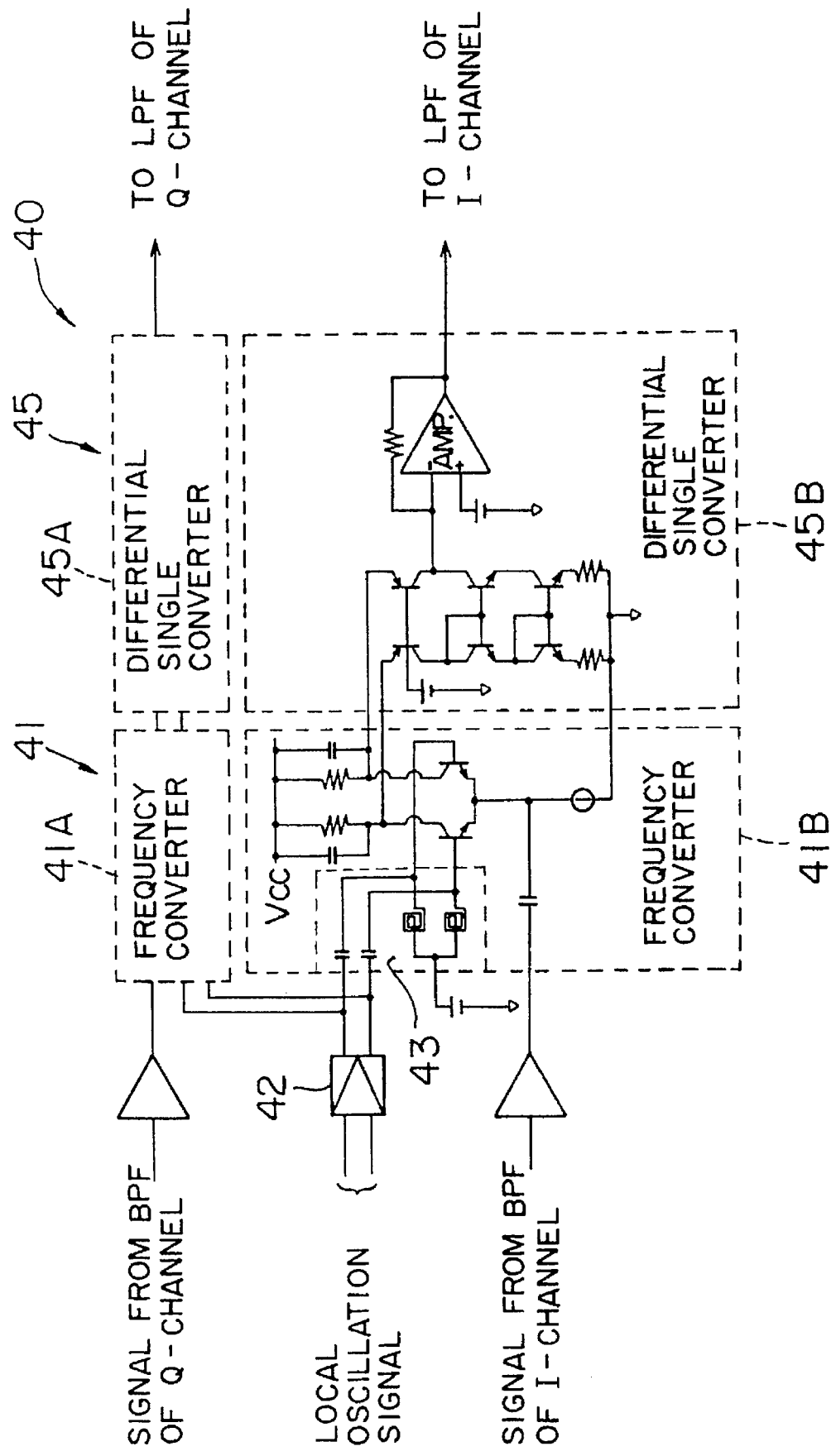
FIG. 17 is a circuit diagram showing a receiver system according to a twelfth embodiment of the present invention.

The circuit having the above constitution is used in a portion of a reception circuit of a portable telephone system, for example. FIG. 17 shows a frequency converter according to a twelfth embodiment as a preferred example applied to a receiver system.

The frequency converter according to a twelfth embodiment applies to a direct conversion receiver system, and there is shown in FIG. 17 an example in which an orthogonal demodulator is constituted from a frequency converter 41 according to the present invention. Since the frequency converter 41 receives a local oscillation frequency substantially the same as a frequency of a received signal to obtain a base band signal, this system is a kind of homodyne receiver systems. Even though the output signal becomes a frequency of the difference between the local oscillation frequency and the received signal frequency, the base band signal of two channels is obtained by dividing The received signal into two kirks and converting frequencies of respective kind of the signal after both kinds of signal respectively have a phase difference of 90 degrees, for the purpose of distinguishing between the cases where the received signal frequency is higher than the frequency of the local oscillation signal and is lower than that. The local oscillation signal is supplied through a buffer amplifier 42 to two frequency converters 41A and 41B. Local oscillation signal input circuits 43 in the frequency converters 41 use spiral inductors realized by an integrated circuit to suppress the low-frequency noises as a noise near the frequency of multiple of zero of the local oscillation frequency, thereby realizing the orthogonal demodulator 40 having an excellent noise characteristic. An output of the frequency converter 41 is supplied to the differential single converter 45, which outputs a single end signal converted from the differential signal in order to supply a desired signal to base band frequency signal (a second intermediate frequency) signal processors 55A and 55B as shown in a system according to a thirteenth embodiment mentioned later.

In the orthogonal demodulator 40 according to the twelfth embodiment, the buffer amplifier 42 has a matching function for matching a transmission line impedance of the local oscillation signal with an input impedance of the buffer amplifier.

FIG. 18 is a block diagram showing a configuration of a receiver system according to a thirteenth embodiment using a direct conversion receiver system. A radio frequency signal which has been received by an antenna portion 51 is converted its frequency on the basis of a local oscillation signal having a frequency substantial the same as the radio frequency signal, so as to obtain a base band signal which will be outputted as received data after a demodulation.

In detail, a high-frequency signal received by the antenna portion 51 is amplified by a high-frequency signal processor 52 and divided into two channels after an unnecessary frequency component is removed by a high-frequency filter. The frequency converter portion converts a frequency of the high-frequency signal by using a reference signal having a predetermined frequency substantially the same as that of the high-frequency signal. Especially in an orthogonal demodulation, there ere prepared two systems of I- and Q-channels of frequency converters and signal processors, in which each of frequency converters 54A and 54B of respective channel converts a frequency by using first and second reference signals S1 and S2 which are respectively shifted with each other by $\pi/2$ by using a $\pi/2$ shifter 53 from the output signal of the local oscillator. Base band signals formed by a frequency conversion are processed in babe band signal processors 55A and 55B, respectively. In detail, a low-pass filter (not shown in the figure) eliminates the unnecessary high-frequency components and an A/D converter (not shown) converts a low component analog signal into a digital signal. After that, an output portion 56 demodulates the digital signal by using an orthogonal rectifying detection system such as a delay rectify detector, and data signals such as voice, image and the like are reproduced.

Figure 19:
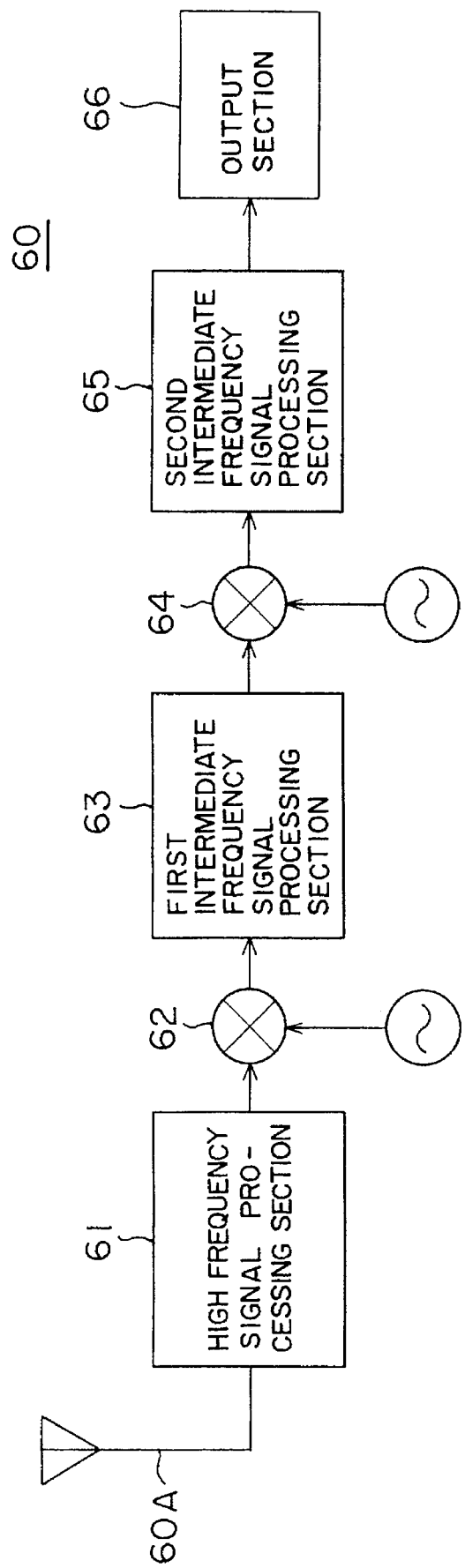
FIG. 19 is a block diagram showing a receiver system according to a fourteenth embodiment of the present invention.

FIG. 19 is a block diagram showing a configuration of a receiver 60 according to a fourteenth embodiment and using a super heterodyne receiver system. In the figure, a high-frequency signal processing section 61 selects a signal component in a desired frequency band from a received signal through an antenna 60A and amplifies a selected signal component to output a first intermediate frequency signal after a frequency conversion in a first signal converter 62. Furthermore, a first intermediate frequency signal processing section 63 removes an unnecessary frequency component and amplifies the unnecessary frequency component removed signal, and a second frequency converter 64 converts the first intermediate frequency signal into a second intermediate frequency signal. The second intermediate frequency signal is amplified in a second intermediate frequency signal processing section 65 after removing an unnecessary signal component, end an output section 66 outputs data signals including voices and images after a digital signal processing.

What is claimed is:

1. A frequency converter capable of reducing a noise component in a local oscillation signal: comprising a high frequency signal input circuit for inputting a high-frequency signal, for producing the high-frequency signal with bias voltage or current, and for outputting a bias-added high-frequency signal;

a local oscillation signal input circuit for inputting a local oscillation signal, and including at least bias adding means for outputting a bias-added local oscillation signal after adding the local oscillation signal with bias voltage or current, and even harmonic suppression means for suppressing a noise component having a frequency in the vicinity of a frequency which is multiple of even number of a local oscillation frequency of the local oscillation signal so as to output a bias-added and even-noise suppressed local oscillation signal in which noises having frequency of multiple of even number are reduced; and a multiplication circuit for inputting the bias-added high-frequency signal supplied from the high-frequency signal input circuit and the bias-added and even-noise suppressed local oscillation signal supplied from the local oscillation signal input circuit, and multiplying both the signals to output a product of the bias-added high-frequency signal and the bias-added and even-noise suppressed local oscillation signal.

2. The frequency converter according to claim 1, wherein the local oscillation signal input circuit comprises an amplifier circuit for only amplifying the local oscillation signal and for suppressing a low-frequency noise component included in the local oscillation signal.

3. The frequency converter according to claim 1, wherein the even harmonic suppression means comprises a pair of transmission lines and for suppressing the noise component having a frequency near the frequency of multiple of even number of the local oscillation frequency of the local oscillation signal.

4. The frequency converter according to claim 1, wherein the local oscillation signal input circuit has a single ended input of the local oscillation signal.

5. The frequency converter according to claim 1, wherein the local oscillation signal input circuit has a differential input of the local oscillation signal.

6. The frequency converter according to claim 1, wherein the local oscillation signal input circuit comprises the even harmonic suppression means for specifically suppressing noise components having a frequency near a frequency multiple of the frequency of the local oscillation signal.

7. The frequency converter according to claim 1, wherein the local oscillation signal input circuit comprises the even harmonic suppression means for suppressing noise components having a frequency near a frequency multiple of zero of the frequency of the local oscillation signal.

8. The frequency converter according to claim 1, wherein the multiplication circuit is comprised of a single balance multiplication circuit which comprises a load circuit, a differential pair comprised of a pair of transistors having bases respectively receiving a plus component and a minus component of the bias-added and even-noise suppressed local oscillation signal supplied from the local oscillation signal input circuit, and an amplifier circuit for amplifying the bias-added high-frequency signal supplied from the high-frequency input circuit.

9. The frequency converter according to claim 1, wherein the multiplication circuit is comprised of a double balance multiplication circuit which comprises a load circuit, a differential pair having two pairs of transistors each pair having bases respectively receiving a plus component and a minus component of the bias-added and even noise suppressed local oscillation signal supplied from the local oscillation signal input circuit, and a pair of amplifier circuits respectively amplifying a plus component and a minus component of the bias-added high-frequency signal supplied from the high-frequency signal input circuit.

10. A radio receiver system capable of reducing a noise component included in a reproduced signal, comprising a reception section for receiving a radio frequency signal including a high-frequency signal through an antenna:

a frequency converter section including a high-frequency signal input circuit for producing a high-frequency signal inputted from the reception section with bias voltage or current, a local oscillation signal input circuit for adding, to bias voltage or current, a local oscillation signal having a local oscillation frequency substantially equal to a frequency of the high-frequency signal received by the reception section to output a bias-added local oscillation signal and for suppressing a noise component having a frequency near a frequency multiple of even number of the bias-added local oscillation signal to output a noise suppressed signal, and a multiplication circuit for multiplying the bias-added high-frequency signal and the noise suppressed local oscillation signal; and a signal processing section for inputting a converted signal supplied from the frequency converter section and outputting a desired frequency signal which is generated by eliminating a signal component of an unnecessary frequency band from a converted signal end including only a signal component proper for a reproduction.

11. The radio receiver system according to claim 10, wherein the frequency converter section comprises I-channel and Q-channel frequency converters for converting respective frequencies divided into two systems of an I-channel and a Q-channel from the high-frequency signal received by the reception section;

the signal processing section comprises I-channel and Q-channel base band signal processors for respectively processing base band signals included in respective systems of the I-channel and Q-channel frequency converters; and the receiver system outputs reception data demodulated from the base band signal included in the radio frequency signal received by a direct conversion receiver system comprising the I-channel and Q-channel systems.

12. The radio receiver system according to claim 10, wherein the receiver system is comprised of a super heterodyne receiver system comprising the reception section including an antenna and a first high-frequency signal processing section; a first frequency converter for converting and outputting a first intermediate frequency signal from the high-frequency signal by multiplying bias-added high-frequency signal and a bias-added and even-noise suppressed signal respectively supplied from the high-frequency signal processor and a first local oscillator to output a first intermediate frequency signal; a first intermediate frequency signal processing section for amplifying a first processed intermediate frequency signal after removing an unnecessary component included in the first intermediate frequency signal; a second frequency converter for inputting the first processed intermediate frequency signal from the first intermediate frequency processing section and an output of a second local oscillator and for multiplying the bias-added intermediate frequency signal and a bias-added and even-noise suppressed local oscillation signal to convert the first intermediate frequency signal into a second intermediate frequency signal; a second intermediate frequency signal processing section for amplifying and outputting a second processed intermediate frequency signal after an unnecessary component is removed from the second intermediate frequency signal; and an output section for outputting data signals after the second processed intermediate frequency signal is converted into a digital signal.

* * * * *